United States Patent [19]
Yu et al.

[11] Patent Number: 5,856,227
[45] Date of Patent: Jan. 5, 1999

[54] METHOD OF FABRICATING A NARROW POLYCIDE GATE STRUCTURE ON AN ULTRA-THIN GATE INSULATOR LAYER

[75] Inventors: Chen-Hua Yu; Chia-Shiung Tsai, both of Hsin-Chu, Taiwan

[73] Assignee: Taiwan Semiconductor Manufacturing Company, Ltd., Hsin-Chu, Taiwan

[21] Appl. No.: 847,223

[22] Filed: May 1, 1997

[51] Int. Cl.⁶ ...................... H01L 21/265; H01L 21/8234
[52] U.S. Cl. ........................................... 438/305; 438/592
[58] Field of Search ..................... 438/305, 592, 438/177, 193

[56] References Cited

U.S. PATENT DOCUMENTS

| | | | |
|---|---|---|---|
| 4,837,180 | 6/1989 | Chao | 438/305 |
| 4,906,589 | 3/1990 | Chao | 438/304 |
| 4,963,504 | 10/1990 | Huang | 438/305 |
| 5,032,535 | 7/1991 | Kamjo et al. | 438/305 |
| 5,202,277 | 4/1993 | Kameyama et al. | 438/305 |
| 5,585,295 | 12/1996 | Wu | 438/305 |
| 5,672,544 | 9/1997 | Pan | 438/305 |
| 5,677,217 | 10/1997 | Tseng | 438/305 |

*Primary Examiner*—Richard Booth
*Attorney, Agent, or Firm*—George O. Saile; Stephen B. Ackerman

[57] ABSTRACT

A process for creating a MOSFET device, with a narrow polycide gate structure, on an ultra-thin gate oxide, has been developed. The process features partially etching of a polysilicon layer, used in the polycide structure, to a level in which only a thin residual layer of the polysilicon remains. After formation of a lightly doped source and drain region, formed via ion implantation through the thin residual polysilicon layer, an oxidation is performed to convert the thin residual polysilicon layer, to an oxide layer. The ability to complete the patterning of the polysilicon layer using oxidation procedures, avoids the risk of RIE trenching or pitting, that can occur if the polysilicon layer is patterned using only RIE procedures.

20 Claims, 3 Drawing Sheets

METHOD OF FABRICATING A NARROW POLYCIDE GATE STRUCTURE ON AN ULTRA-THIN GATE INSULATOR LAYER

BACKGROUND OF THE INVENTION (1) Field of the Invention

The present invention relates to methods used for fabrication of metal oxide semiconductor filed effect transistors, (MOSFET), devices, and more specifically to a process used to create a polycide gate structure, on a thin gate insulator layer.

(2) Description of Prior Art

The semiconductor industry is continually striving to improve the performance of semiconductor devices while still attempting to decrease the cost of semiconductor chips. These objectives have been successfully addressed via the use of micro-miniaturization, or the use of sub-micron features, in semiconductor devices. Smaller features reduce performance degrading capacitances and resistances, resulting in faster devices. The use of smaller features also allow smaller chips to be fabricated, still possessing the same level of integration as counterparts with larger features, and thus allowing more, smaller, chips to be realized from a starting wafer, thus reducing the processing costs for a specific chip.

Micro-miniaturization has been realized by advances in specific semiconductor fabrication disciplines, such as photolithography and dry etching. The use of more sophisticated exposure cameras, as well as the use of more sensitive photoresist materials, have allowed sub-micron features to be routinely obtained in photoresist layers. In addition the use of advanced dry etching tools and processes, have allowed the sub-micron images in photoresist layers, to be successfully transferred to underlying materials used in the fabrication of advanced semiconductor devices. However when attempting to use micro-miniaturization to fabricate advanced semiconductor devices, for example using narrow polycide, (metal silicide-polysilicon), gate structure, on very thin gate oxide layers, special care must be used in order to avoid problems associated with the smaller device features. For example during the definition of a narrow polycide gate structure, via the use of anisotropic dry etching procedures, micro-trenches can be created at the foot, or edges, of the narrow polycide gate structure, during the patterning of the polysilicon layer, which underlies the metal silicide layer of the polycide structure. The trenching phenomena, more pronounced with narrower features, can lead to yield loss resulting from polysilicon gate to substrate leakages or shorts. In addition to severe over etch of the polysilicon, in the polycide gate structure occurs, etch pits can also be formed in the subsequent source and drain region, again possibly adversely influencing device yield. If the selectivity of the polysilicon etch procedure is increased to decrease the occurrence of trenching or pitting, the profile of the polycide gate structure can be tapered, thus adversely influencing yield and performance.

This invention will offer a process for forming polycide gate structures, in which trenching and pitting phenomena are avoided by terminating the polysilicon etch procedure, prior to exposure of the underlying gate oxide layer. With about 100 to 200 Angstroms of polysilicon remaining in subsequent source and drain regions, the etch procedure is terminated. The lightly doped source and drain region, (LDD), is implanted through the very thin residual polysilicon layer, into the underlying substrate. An oxidation procedure, used to create a sidewall insulator layer for the polycide gate structure, results in the oxidation of the residual polysilicon, on the LDD region, subsequently removed during the formation of an insulator spacer, on the sides of the polycide gate structure. Prior art, such as an invention offered by Kamijo, et al, in U.S. Pat. No. 5,032, 535, describe a process in which a partial dry etching procedure, for a polysilicon gate structure, is used. However their process is completed with additional dry etching, thus being exposed to the trenching and pitting phenomena. Our invention features the use of oxidation to complete the formation of the polysilicon portion of the polycide gate structure.

SUMMARY OF THE INVENTION

It is an object of the invention to create a MOSFET device featuring a narrow polycide gate structure, on an ultra-thin gate oxide layer.

It is another object of this invention to define the narrow polycide gate structure via an anisotropic reactive ion etch, (RIE), of a polysilicon layer, to a level in which a thin, residual polysilicon layer remains, overlying subsequent source and drain regions.

It is yet another object of this invention to create a lightly doped source and drain region, via ion implantation through the thin, residual polysilicon layer.

It is still yet another object of this invention to convert the thin, residual polysilicon layer to an oxide layer, during an oxidation procedure, used to create an insulator sidewall on the narrow polycide gate structure.

In accordance with the present invention a process for forming a narrow polycide gate structure on an ultra-thin gate oxide layer, without the risk of trenching or pitting during the polysilicon etching sequence of the polycide gate patterning, is described. An ultra-thin gate oxide is thermally grown on the surface of a semiconductor substrate, followed by the deposition of a polysilicon layer. An overlying metal silicide layer, as well as an overlying silicon oxide layer, are next deposited. Patterning, using photolithographic and anisotropic RIE are used to define the desired narrow polycide gate structure in the silicon oxide layer, in the metal silicide layer, and in a top portion of the polysilicon layer, leaving between about 100 to 200 Angstroms of the bottom portion of the polysilicon layer, unetched. After removal of photoresist, and polymer cleanup, an ion implantation procedure is performed through the thin, residual polysilicon layer, placing the dopants needed for a lightly doped source and drain region, in an underlying region of the semiconductor substrate. An oxidation procedure, used to grow a first insulator sidewall layer, on the sides of the narrow polycide gate structure, also converts the thin residual polysilicon layer, to a silicon oxide layer. Deposition of another insulator layer, followed by an anisotropic RIE procedure, is used to create a second insulator sidewall layer, on the sides of the narrow polycide gate structure. A heavily doped source and drain region is next formed in regions of the semiconductor substrate, not covered by the narrow polycide gate structure, or by the insulator sidewall layers. Deposition of an interlevel insulator layer, is followed by patterning, used to create contact hole openings to source and drain regions, and to the narrow polycide gate structure. Metal contact structures, to the source and drain, and to the narrow polycide gate structure, complete the procedure of creating a narrow polycide gate structure, on an ultra-thin gate oxide layer.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of forming a narrow polycide gate structure, on an ultra-thin gate oxide layer, using a polysilicon etch procedure, which terminates with a thin residual polysilicon layer remaining, to be subsequently converted to a oxide layer, will now be described in detail. This invention is described for an N channel, MOSFET device. However this invention can also be used for a P channel, MOSFET, creating an N well region, in a P type substrate, and ion implanting boron type dopants, through the thin residual polysilicon layer, into the N well region. This invention can also be used for complimentary, (CMOS), devices, as well as for BiCMOS devices.

Figure 1:
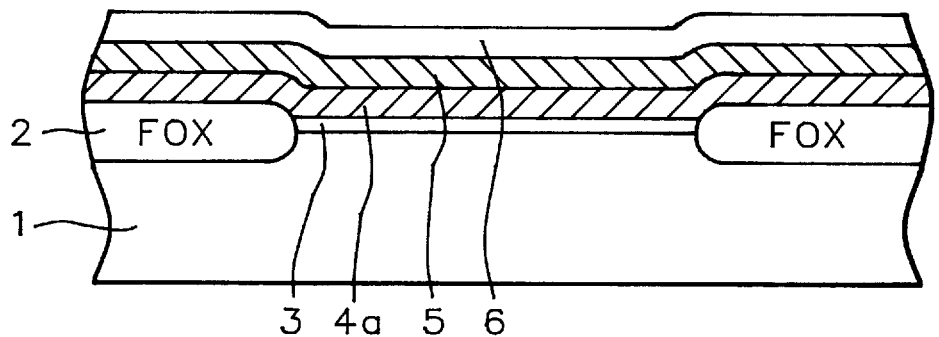
FIGS. 1–6, which schematically, in cross-sectional style, describe key stages of fabrication used in the creation of a narrow polycide gate structure, on an ultra-thin gate oxide layer.

A P type, semiconductor substrate 1, comprised of single crystalline silicon, with a <100> crystallographic orientation is used, and shown schematically in FIG. 1. Thick field oxide, (FOX), regions 2, are thermally grown and used for isolation purposes. FOX regions 2, are thermally grown, in an oxygen—steam ambient, at a temperature between about 850° to 1050° C., to a thickness between about 3000 to 5000 Angstroms. Subsequent device regions, or regions not subjected to the FOX oxidation procedures, are protected by an oxidation resistant, composite masking layer, comprised of an overlying silicon nitride layer, and an underlying silicon oxide pad layer. The oxidation resistant composite masking layer is formed by initially forming a silicon oxide layer on semiconductor substrate 1, followed by the deposition of a silicon nitride layer. Conventional photolithographic and anisotropic RIE procedures, create the desired pattern in the oxidation resistant, composite masking layer. After photoresist removal, followed by creation of FOX regions 2, the oxidation resistant, composite oxidation masking layer is removed using hot phosphoric acid for the silicon nitride layer, and a buffered hydrofluoric acid solution for the silicon oxide pad layer.

An ultra-thin, silicon dioxide gate oxide layer 3, shown schematically in FIG. 1, is next thermally grown, at a temperature between about 800° to 900° C., to a thickness between about 40 to 125 Angstroms. A polysilicon layer 4a, is then deposited using low pressure chemical vapor deposition, (LPCVD), procedures, at a temperature between about 500° to 600° C., to a thickness between about 1000 to 1500 Angstroms, using silane as a source. A LPCVD deposition of tungsten silicide 5, is performed, at a temperature between about 450° to 600° C., to a thickness between about 1000 to 1500 Angstroms, using tungsten hexafluoride and silane as a source. Finally a silicon oxide layer 6, is deposited, using LPCVD or plasma enhanced chemical vapor deposition, (PECVD), procedures, at a temperature between about 400° to 500° C., to a thickness between about 1000 to 2000 Angstroms, using tetraethylorthosilicate, (TEOS), as a source. The use of silicon oxide layer 6, is optional, and can be used, if desired, for certain applications. The result of these depositions are schematically shown in FIG. 1.

Another embodiment is to use only polysilicon layer 4a, at a thickness between about 2000 to 2500 Angstroms, without the use of overlying tungsten silicide layer 5, and silicon oxide layer 6. However in this invention a narrow polycide gate structure 20, will be described, with polycide structure 20, comprised of a metal silicide layer 5, on an underlying polysilicon layer 4a.

Figure 2:
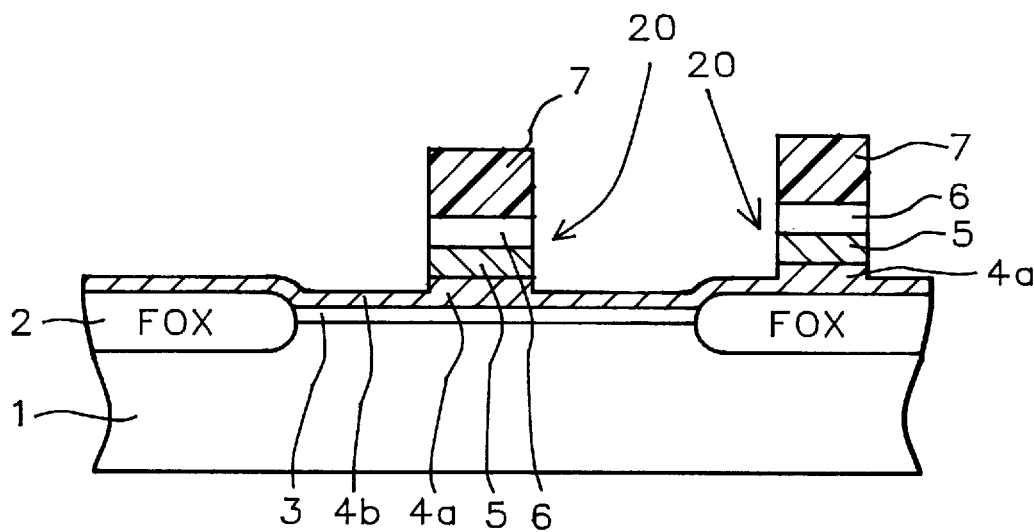

A photoresist shape 7, between about 0.20 to 0.45 $\mu$M in width, is next formed to supply the masking feature for the narrow polycide gate structure 20. An anisotropic RIE procedure, using $CHF_3$ is used to etch silicon oxide layer 6, while $Cl_2$ and $O_2$ are used to etch tungsten silicide layer 5. The critical partial etch of polysilicon layer 4a, is next performed via anisotropic RIE procedures, using $Cl_2$ and HBr as etchants. The partial etch procedure removes between about 800 to 1400 Angstroms of polysilicon layer 4a, resulting in a thin residual polysilicon layer 4b, between about 100 to 200 Angstroms in thickness, remaining in regions not covered by the resulting polycide gate structure 20, featuring the narrow polysilicon gate structure 4a. The width of the polycide gate structure 20, comprised of the narrow polysilicon gate structure 4a, is between about 0.20 to 0.45 $\mu$M. The termination of the anisotropic RIE procedure, prior to complete removal of polysilicon layer 4a, prevented possible trenching in semiconductor substrate 1, at the edges of the polycide structure 20. This can occur due to the inability of ultra-thin silicon oxide layer 3, to contain the polysilicon RIE procedure, at endpoint. If a more selective RIE ambient was chosen, to allow the ultra-thin silicon oxide layer 3, to contain the polysilicon RIE ambient, at endpoint, the straight edged profile of the polycide structure 20, may not have been maintained. The result of these etching procedures are schematically shown in FIG. 2.

Figure 3:
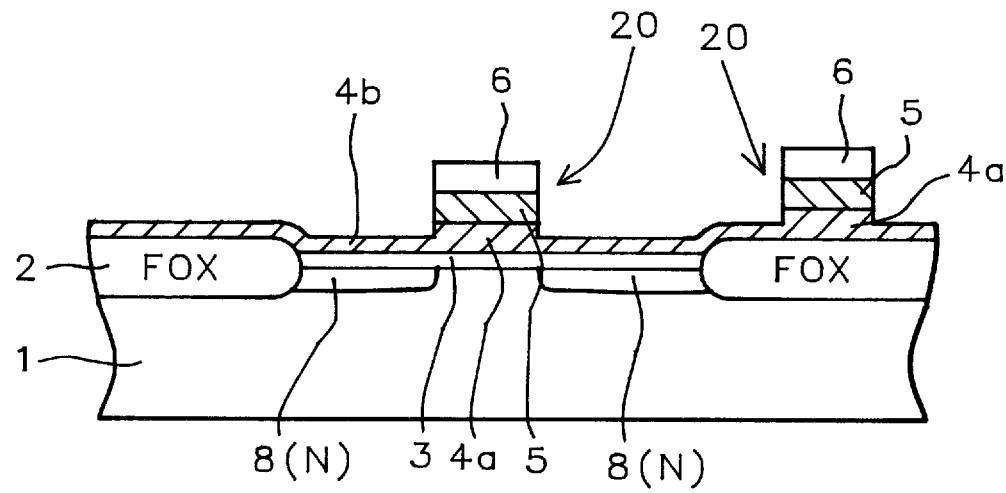
Figure 4:
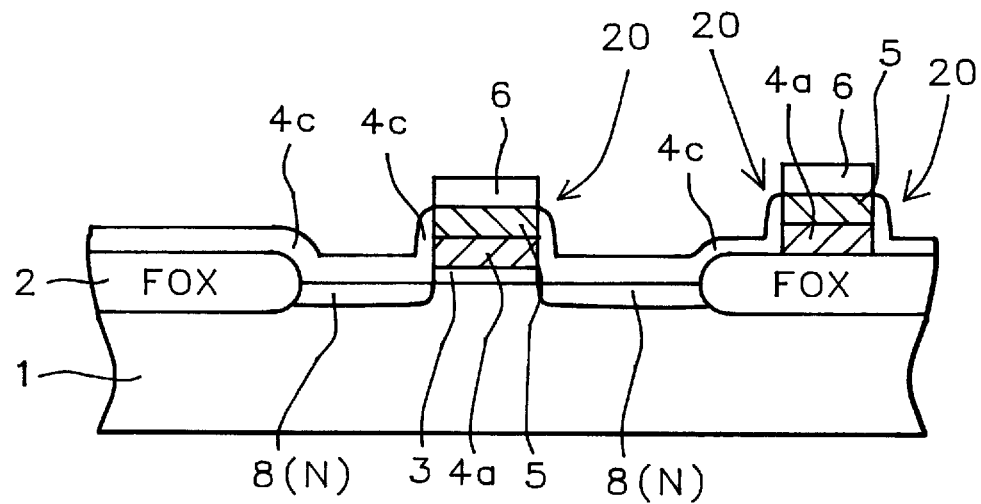

Photoresist shape 7, is removed using plasma oxygen ashing and careful wet cleans. This procedure also removes any polymer formation that may have formed during the previous anisotropic RIE procedure. An ion implantation procedure, using arsenic or phosphorous, is next performed at an energy between about 40 to 60 KeV, to a dose between about 4E13 to 8E13 atoms/$cm_2$, to create lightly doped source and drain regions 8, schematically shown in FIG. 3. The implantation procedure was performed at an energy great enough to easily clear the 100 to 200 Angstroms of thin residual polysilicon layer 4b. An oxidation procedure, performed in an oxygen—steam ambient, at a temperature between about 700° to 900° C., is used to grow between about 70 to 90 Angstroms of silicon oxide layer 4c, on the exposed sides of polysilicon layer 4a, as well as on the exposed sides of tungsten silicide layer 5. This oxidation procedure also converts the entire thickness of thin residual polysilicon layer 4b to silicon oxide layer 4c. This is schematically shown in FIG. 4.

Figure 5:
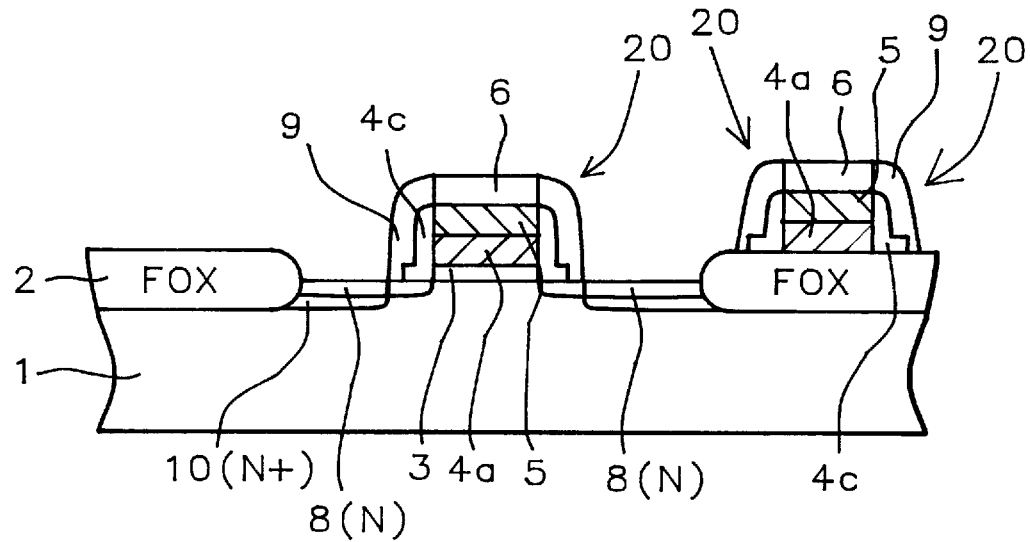

An insulator layer of either silicon nitride or silicon oxide, is next deposited using LPCVD or PECVD procedures, at a temperature between about 400° to 800° C., to a thickness between about 1000 to 2000 Angstroms. An anisotropic RIE procedure, using $CHF_3$ as an etchant, is used to create insulator spacer 9, shown schematically in FIG. 5. The anisotropic RIE procedure, also removes silicon oxide layer 4c, from the top surface of lightly doped source and drain region 8. Another ion implantation procedure, using arsenic or phosphorous, is performed at an energy between about 40 to 60 KeV, at a dose between about 4E13 to 8E13 atoms/$cm_2$, to create heavily doped source and drain regions 10, shown schematically in FIG. 5.

Figure 6:
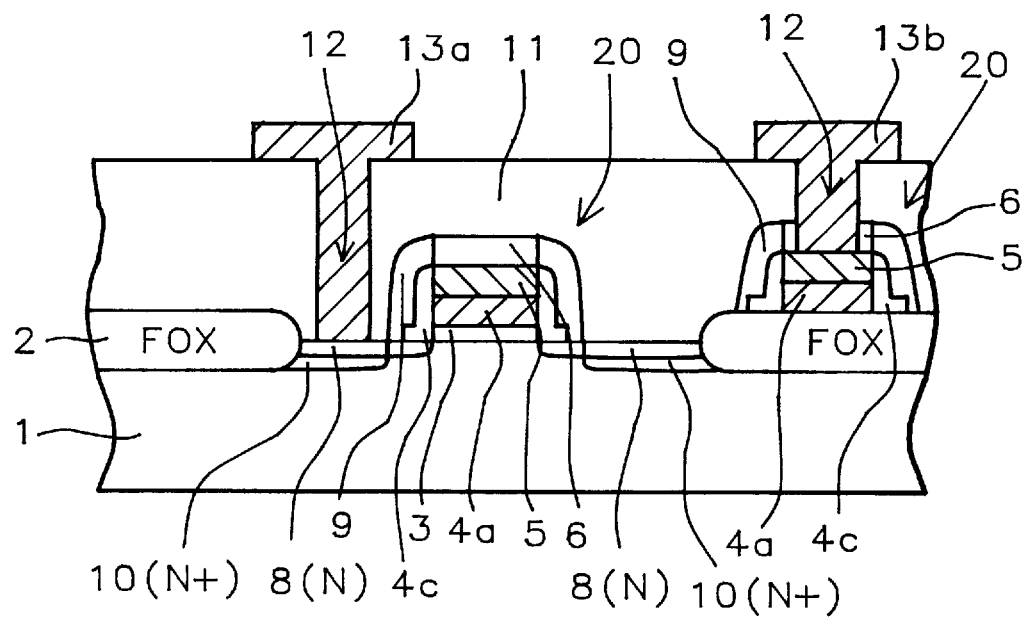

An interlevel insulator layer 11, of silicon oxide, or silicon oxide containing small amounts of $B_2O_3$ or $P_2O_5$, is deposited using PECVD procedures, at a temperature between about 400° to 800° C., to a thickness between about 3000 to 8000 Angstroms. Planarization of interlevel insulator layer 11, is performed using a chemical mechanical polishing, (CMP), procedure, to result in a smooth top surface topography for interlevel insulator layer 11. Contact holes 12, to heavily doped source and drain region 10, and to the top surface of polycide gate structure 20, on FOX region 2, are created via conventional photolithographic and anisotropic RIE procedures, using $CHF_3$ as an etchant for interlevel insulator layer 11, and for silicon oxide layer 6. After removal of photoresist using plasma oxygen ashing and careful wet cleans, a metal layer of aluminum, containing between about 1 to 3% copper, and between about 0 to 1% silicon, is deposited using r.f. sputtering procedures, to a thickness between about 2500 to 5000 Angstroms. Conventional photolithographic and anisotropic RIE procedures, using $CL_2$ as an etchant, are used to create metal contact structures 12, shown schematically in FIG. 6. Photoresist is again removed via plasma oxygen ashing procedures and careful wet cleans.

While this invention has been particular;y shown and described with reference to, the preferred embodiments thereof, it will be understood by those skilled in the art that various changes in form and details may be made without departing from the spirit and scope of this invention.

What is claimed is:

1. A method for fabricating a MOSFET device, on a semiconductor substrate, comprising the steps of:

forming field oxide regions in said semiconductor substrate;

growing a gate insulator layer on said semiconductor substrate, in areas not covered by said field oxide regions;

depositing a polysilicon layer;

depositing a metal silicide layer on said polysilicon layer;

depositing a first insulator layer on said metal silicide layer;

forming a photoresist layer into a mask on a top surface of said first insulator layer;

using said mask for patterning of said first insulator layer, for patterning of said metal silicide layer, and for patterning of a top portion of said polysilicon layer, to create a polycide gate structure having exposed sides, comprised of said metal silicide overlying said top portion of said polysilicon layer, on said gate insulator layer, while leaving a residual bottom portion of said polysilicon layer, in regions not covered by said photoresist mask;

removal of said photoresist mask;

ion implanting a first conductivity imparting dopant, through said residual bottom portion of said polysilicon layer, into a region of said semiconductor substrate, not covered by said polycide gate structure, to create a lightly doped source and drain region;

oxidizing to grow a silicon oxide sidewall layer on the exposed sides of said polycide gate structure, while converting said residual bottom portion of said polysilicon layer, to a first silicon oxide layer;

depositing a second insulator layer;

anisotropic etching of said second insulator layer to create an insulator spacer, overlying said silicon oxide sidewall layer;

ion implanting a second conductivity imparting dopant, into a region of said semiconductor substrate, not covered by said polycide gate structure, not covered by said insulator spacer, and not covered by said silicon oxide sidewall layer, to create a heavily doped source and drain region;

depositing an interlevel insulator layer;

opening a contact hole in said interlevel insulator layer, to expose the top surface of said heavily doped source and drain region, and opening a contact hole in said interlevel insulator layer and in said first insulator layer, to expose the top surface of said polycide gate structure; and forming metal contact structures to said heavily doped source and drain region, and to said polycide gate structure.

2. The method of claim 1, wherein said gate insulator layer is silicon dioxide thermally grown in an oxygen steam ambient, at a temperature between about 800° to 900° C., to a thickness between about 40 to 125 Angstroms.

3. The method of claim 1, wherein said polysilicon layer is deposited using LPCVD procedures, at a temperature between about 500° to 600° C., to a thickness between about 1000 to 1500 Angstroms, using silane as a source gas.

4. The method of claim 1, wherein said metal silicide layer is tungsten silicide, deposited using LPCVD procedures, at a temperature between about 500° to 600° C., to a thickness between about 1000 to 1500 Angstroms, using tungsten hexafluoride and silane as source gasses.

5. The method of claim 1, wherein said polycide gate structure, having a width between about 0.20 to 0.45 $\mu M$, is formed via anisotropic RIE, using $CHF_3$ as an etchant for said first insulator layer, using $Cl_2$—$O_2$ as an etchant for said metal silicide layer, and using $Cl_2$—HBr as an etchant for said top portion said of said polysilicon layer, leaving said residual bottom portion of said polysilicon layer, between about 100 to 200 Angstroms in thickness, unetched.

6. The method of claim 1, wherein said first conductivity imparting dopant is arsenic or phosphorous, ion implanted through said residual bottom polysilicon layer, at an energy between about 40 to 60 KeV, and at a dose between about 4E13 to 8E13 atoms/$cm^2$.

7. The method of claim 1, wherein said first silicon oxide layer, is formed from thermal oxidation of said residual bottom portion of said polysilicon layer, in an oxygen—steam ambient, at a temperature between about 700° to 900° C., to a thickness between about 70 to 90 Angstroms.

8. The method of claim 1, wherein said insulator spacer is silicon nitride, formed by deposition using LPCVD procedures, to a thickness between about 1000 to 2000 Angstroms, and etched by anisotropic RIE procedures, using $CHF_3$, or $Cl_2$, or $SF_6$ as an etchant.

9. The method of claim 1, wherein said insulator spacer is silicon oxide, formed by deposition using LPCVD procedures, to a thickness between about 1000 to 2000 Angstroms, and etched by anisotropic RIE procedures, using $CHF_3$ as an etchant.

10. A method of fabricating a polycide gate structure, on a gate oxide layer, for a MOSFET device, on a semiconductor substrate, in which the formation of said polycide gate structure is performed via a dry etching procedure, featuring the removal of only a top portion of the polysilicon layer, used in the polycide gate structure, comprising the steps of:

growing said gate oxide layer on said semiconductor substrate;

depositing said polysilicon layer;

depositing a tungsten silicide layer;

depositing a first silicon oxide layer;

forming a photoresist layer into a mask on the top surface of said first silicon oxide layer;

using said mask to create said polycide gate structure having exposed sides, on said gate oxide layer, via anisotropic dry etching of said first silicon oxide layer, via anisotropic dry etching of said tungsten silicide layer, and via anisotropic dry etching of said top portion of said polysilicon layer, leaving a residual bottom portion of said polysilicon layer, in regions not covered by said photoresist mask;

removal of said photoresist mask;

ion implanting a first conductivity imparting dopant though said residual bottom portion of said polysilicon layer, into a region of said semiconductor substrate, not covered by said polycide gate structure, to create a lightly doped source and drain region;

oxidizing to convert said residual bottom portion of said polysilicon layer to a second silicon oxide layer, while forming a silicon oxide sidewall layer on the exposed sides of said polycide gate structure;

depositing an insulator layer;

anisotropic dry etching of said insulator layer to form an insulator spacer on the sides of said polycide gate structure;

ion implanting a second conductivity imparting dopant into a region of said semiconductor substrate, not covered by said polycide gate structure, and not covered by said insulator spacers, to create a heavily doped source and drain region;

depositing an interlevel insulator layer;

opening a contact hole in said interlevel insulator layer, to expose the top surface of said heavily doped source and drain region, and opening a contact hole in said interlevel insulator layer and in said first silicon oxide layer, to expose the top surface of said polycide gate structure; and forming metal contact structures to said heavily doped source and drain region, and to said polycide gate structure.

11. The method of claim 10, wherein said gate oxide layer is silicon dioxide, thermally grown in an oxygen—steam ambient at a temperature between about 800° to 900° C., to a thickness between about 40 to 125 Angstroms.

12. The method of claim 10, wherein said polysilicon layer is deposited using LPCVD procedures, at a temperature between about 500° to 600° C., to a thickness between about 1000 to 1500 Angstroms, using silane as a source gas.

13. The method of claim 10, wherein said tungsten silicide layer is deposited using LPCVD procedures, at a temperature between about 500° to 600° C., to a thickness between about 1000 to 1500 Angstroms, using tungsten hexafluoride and silane as source gasses.

14. The method of claim 10, wherein said first silicon oxide layer is deposited using PECVD or LPCVD procedures, at a temperature between about 400° to 500° C., to a thickness between about 1000 to 2000 Angstroms, using TEOS as a source gas.

15. The method of claim 10, wherein said polycide gate structure has a width between about 0.20 to 0.45 $\mu$M.

16. The method of claim 10, wherein said polycide gate structure is formed via anisotropic RIE procedures, using $CHF_3$ as an etchant for said first silicon oxide layer, using $Cl_2$—$O_2$ as an etchant for said tungsten silicide layer, and using $Cl_2$—HBr as an etchant to remove between about 800 to 1400 Angstroms of said polysilicon layer, leaving said residual bottom portion of said polysilicon layer, between about 100 to 200 Angstroms, unetched.

17. The method of claim 10, wherein said first conductivity imparting dopant is arsenic or phosphorous, ion implanted through said residual bottom portion of said polysilicon layer at an energy between about 40 to 60 KeV, at a dose between about 4E13 to 8E13 atoms/cm$^2$, to create said lightly doped source and drain region.

18. The method of claim 10, wherein said second silicon oxide layer is formed using thermal oxidation of said residual bottom portion of said polysilicon layer, in an oxygen—steam ambient, at a temperature between about 700° to 900° C., to a thickness between about 70 to 90 Angstroms.

19. The method of claim 10, wherein said insulator spacer is composed of silicon nitride, with a thickness between about 1000 to 1500 Angstroms.

20. The method of claim 10, wherein said insulator spacer is composed of silicon oxide, with a thickness between about 1000 to 2000 Angstroms.

* * * * *